United States Patent [19]

Tsai et al.

[11] Patent Number: 5,895,257
[45] Date of Patent: Apr. 20, 1999

[54] LOCOS FIELD OXIDE AND FIELD OXIDE PROCESS USING SILICON NITRIDE SPACERS

[75] Inventors: Chaochieh Tsai, Taichung; Yuan-Chang Huang, Hsin-Chu; Juing-Yi Wu, Chung-Li; Shun-Liang Hsu, Hsin-Chu, all of Taiwan

[73] Assignee: Taiwan Semiconductor Manfacturing Company, Ltd., Hsin-Chu, Taiwan

[21] Appl. No.: 08/691,288

[22] Filed: Aug. 1, 1996

[51] Int. Cl.$^6$ ............................................. H01L 21/76
[52] U.S. Cl. ..................... 438/443; 438/439; 438/297
[58] Field of Search ........................... 438/439, 443, 438/444, 447, 297, 298

[56] References Cited

U.S. PATENT DOCUMENTS

| | | | |
|---|---|---|---|
| 5,393,694 | 2/1995 | Mathews | 437/72 |
| 5,399,520 | 3/1995 | Jang | 437/67 |
| 5,686,346 | 11/1997 | Duane | 438/443 |
| 5,736,451 | 4/1998 | Gayet | 438/443 |
| 5,821,153 | 10/1998 | Tsai et al. | 438/439 |

OTHER PUBLICATIONS

"Reverse Elevated Source/Drain (RESD) MOSFET for Deep Submicron CMOS" by J.R. Pfiester et al, IEDM 192, pp. 885–888 (No date).

"Impact of LDD Spacer Reduction On MOSFET Performance For Subium Gate I Space Pitches" by C. Mazuré et al, IEDM '92, pp. 893–896. (No month).

*Primary Examiner*—Trung Dang
*Attorney, Agent, or Firm*—George O. Saile; Stephen B. Ackerman; Larry J. Prescott

[57] ABSTRACT

A field oxide region and method of forming a field oxide region using a LOCOS process and nitride spacers formed on the sidewalls of the field oxide regions. During the LOCOS process recesses are formed in the field oxide which result in poor step coverage during successive process steps. Nitride spacers are formed on the sidewalls of the field oxide covering the recesses. The spacers provide a smooth surface over the field oxide and improved step coverage during subsequent process steps.

18 Claims, 3 Drawing Sheets

LOCOS FIELD OXIDE AND FIELD OXIDE PROCESS USING SILICON NITRIDE SPACERS

BACKGROUND OF THE INVENTION (1) Field of the Invention

This invention relates to the formation of field oxide isolation regions using local oxidation of silicon and more specifically to the use of nitride spacers to provide a smooth surface on the field oxide to improve step coverage of subsequent process steps.

(2) Description of the Related Art

U.S. Pat. No. 5,399,520 to Jang describes the use of nitride films and trenches formed in the integrated circuit substrate to form field oxide isolation regions. The processes and structure are different from the invention of this Patent Application.

U.S. Pat. No. 5,393,694 to Mathews describes the use of polysilicon to fill recesses in the field oxide isolation regions. The processes and structure are different from the invention of this Patent Application.

A paper entitled "Reverse Elevated Source/Drain (RESD) MOSFET for Deep Submicron CMOS." by J. R. Pfiester et al., IEDM 92, pages 885–888 describes the use of disposable nitride spacers to define selective silicon offset from the gate edge prior to Lightly Doped Drain implantation in a new Reverse Elevated Source/Drain CMOS device.

A paper entitled "IMPACT OF LDD SPACER REDUCTION ON MOSFET PERFORMANCE FOR SUB-µm GATE/SPACE PITCHES," by Carlos Mazuré et al., IEDM 92, pages 893–896 describes the use of nitride spacers and LPCVD TEOS spacers in forming MOSFET devices having sub micron gate/space pitches.

The invention of this Patent Application uses nitride spacers formed on the sidewalls of field oxide regions to fill the recesses formed in the field oxide by over etching thereby providing a smooth surface for subsequent process steps.

SUMMARY OF THE INVENTION

For deep submicron metal oxide semiconductor field effect transistor, or MOSFET, devices retrograde well technology is often used to increase packing density and to avoid latchup. In using retrograde well technology the wells are formed, using ion implantation, after the field oxide isolation regions are formed, resulting in a preference of those parts of the field oxide region near the active regions for oxide etching. Since the well is formed after the field oxide the process steps after formation of the field oxide can cause recesses in the field oxide near the active regions due to over etching. These recesses are shown in FIG. 1 showing a field oxide isolation region 12 formed in a silicon substrate 10. The recesses 14 form near the active regions 16 of the substrate and will cause a problem during subsequent process steps, due to problems with step coverage and the like.

It is an objective of this invention to provide a method of forming field oxide isolation regions which avoids the problems of recess formation on subsequent process steps.

It is a further objective of this invention to provide field oxide isolation regions which avoid the problems of recess formation on subsequent process steps.

These objectives are achieved by forming a layer of silicon nitride on the integrated circuit substrate covering the field oxidation regions. The silicon nitride is dry anisotropically etched leaving silicon nitride on the sidewalls of the field oxide regions thereby forming silicon nitride spacers on the sidewalls of the field oxide isolation regions. These silicon nitride spacers cover the recesses and provide a smooth surface for subsequent process steps.

DESCRIPTION OF THE PREFERRED EMBODIMENTS

Figure 1:
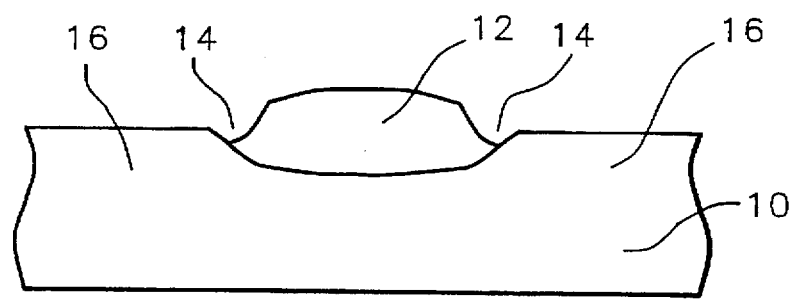
FIG. 1 shows a cross section view of a prior art field oxide isolation region showing recesses formed near the active regions.
Figure 2:
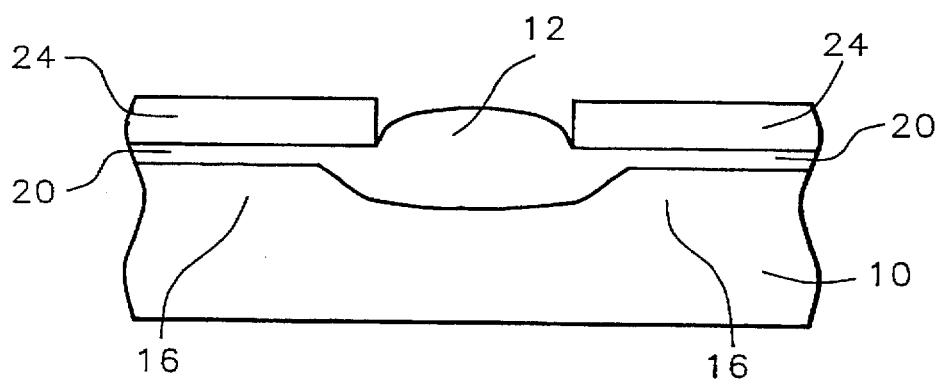
FIG. 2 shows a cross section view of an integrated circuit substrate showing a pad oxide layer, a silicon nitride mask, and a field oxide isolation region.

Refer now to FIGS. 2–9, there is shown an embodiment of the method of this invention for forming field oxide isolation regions using local oxidation of silicon, LOCOS, and silicon nitride spacers. First a layer of pad oxide 20 and a layer of first nitride 24, such as $Si_3N_4$ having a thickness of between about 1000 and 3000 Angstroms, is formed on an integrated circuit substrate 10, see FIG. 2. An opening is formed in the first silicon nitride 24 at the location of the isolation region, thereby removing the pad oxide in the location of the isolation region also, see FIG. 2. Next, as shown in FIG. 2, the field oxide isolation region 12 is grown through the opening in the first silicon nitride layer 24. The field oxide isolation region 12 is adjacent to the active regions 16 of the integrated circuit substrate.

Figure 3:
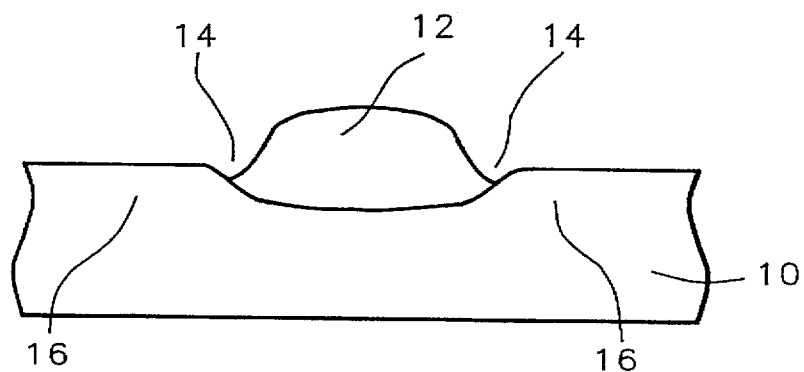
FIG. 3 shows a cross section view of an integrated circuit substrate after the field isolation regions has been formed and the silicon nitride mask has been removed showing the recesses formed next to the active regions.
Figure 4:
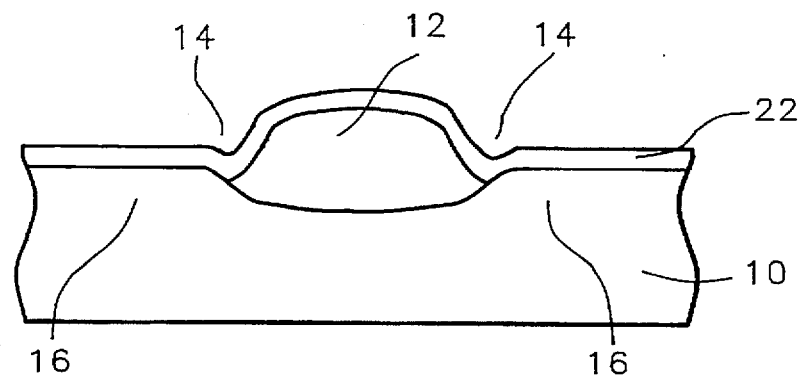
FIG. 4 shows a cross section view of the integrated circuit substrate after formation of the field oxide region with a layer of sacrificial oxide formed over the substrate covering the field oxide regions.

Next, as shown in FIG. 3, the first silicon nitride layer is removed by dipping the substrate 10 in hydrogen fluoride, HF, for between about 5 and 20 seconds and hot phosphoric acid, $H_3PO_4$, at a temperature of between about 130 and 190° C. for between about 30 and 50 minutes. During the removal of the first silicon nitride layer some over etching occurs and recesses 14 are formed in the sidewalls of the field oxide adjacent to the active regions 16. Next, as shown in FIG. 4, a layer of first sacrificial oxide 22, such as $SiO_2$ having a thickness of between about 160 and 240 Angstroms, is formed over the integrated circuit substrate 10. The purpose of this first sacrificial oxide layer is to protect the active region during subsequent processing steps. Next device wells, not shown, are formed in the active regions 16 of the integrated circuit substrate 10 using ion beam implantation.

Figure 5:
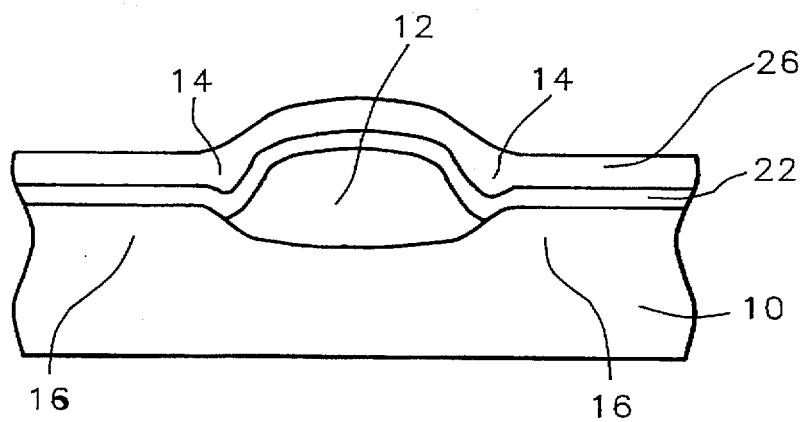
FIG. 5 shows a cross section view of the integrated circuit substrate with a layer of silicon nitride formed over the layer of sacrificial oxide.
Figure 6:
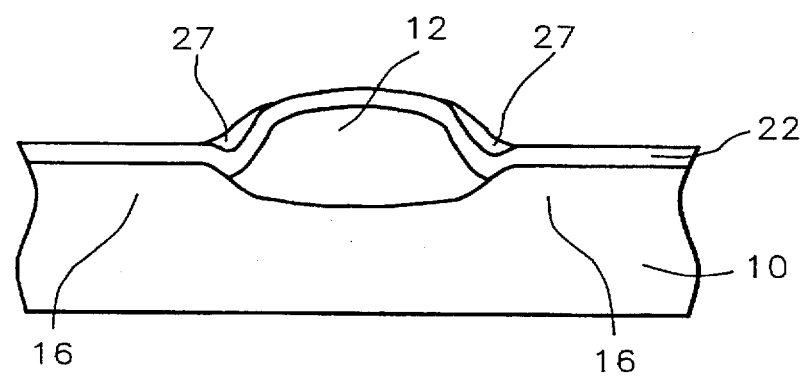
FIG. 6 shows a cross section view of the integrated circuit substrate of FIG. 5 with the silicon nitride layer etched back to form silicon nitride spacers covering the recesses.

As shown in FIG. 5, a layer of second nitride 26, such as silicon nitride $Si_3N_4$ having a thickness of between about 1500 and 3000 Angstroms, is then formed over the layer of first sacrificial oxide 22. Next, as shown in FIG. 6, the second silicon nitride layer is etched back using dry anisotropic etching, such as reactive ion etching, leaving silicon nitride spacers 27 on the sidewalls of the field oxide filling the recesses adjacent to the active regions 16. The silicon nitride spacers 27 provide a smoother surface over the field oxide and will provide for improved step coverage for subsequent process steps.

Figure 7:
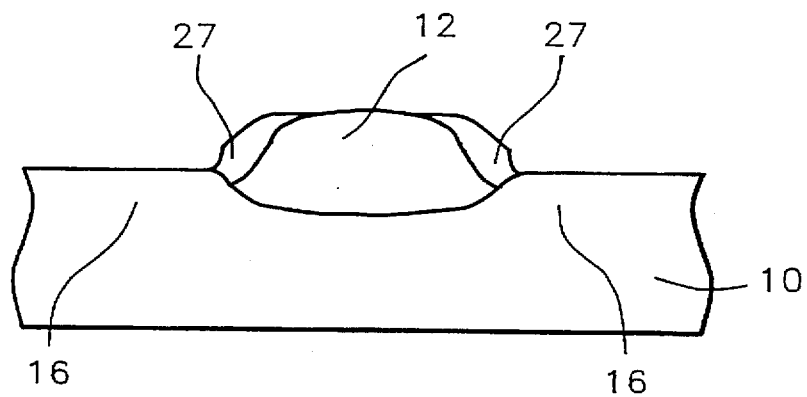
FIG. 7 shows a cross section view of the integrated circuit substrate of FIG. 6 after removal of the sacrificial oxide layer.
Figure 8:
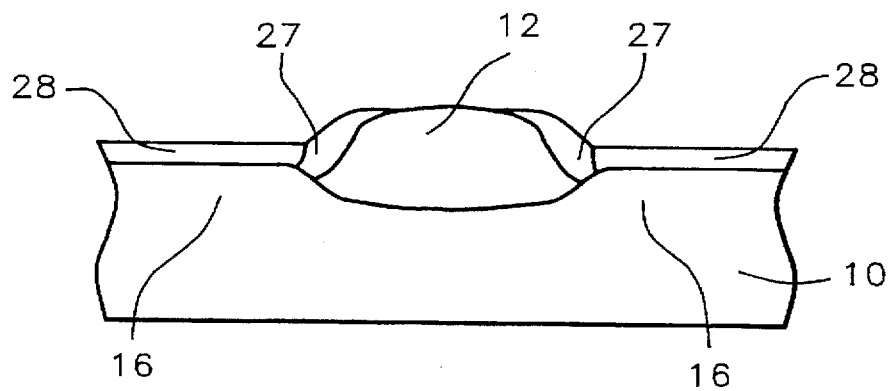
FIG. 8 shows a cross section view of the integrated circuit substrate of FIG. 7 after formation of the gate oxide layer.
Figure 9:
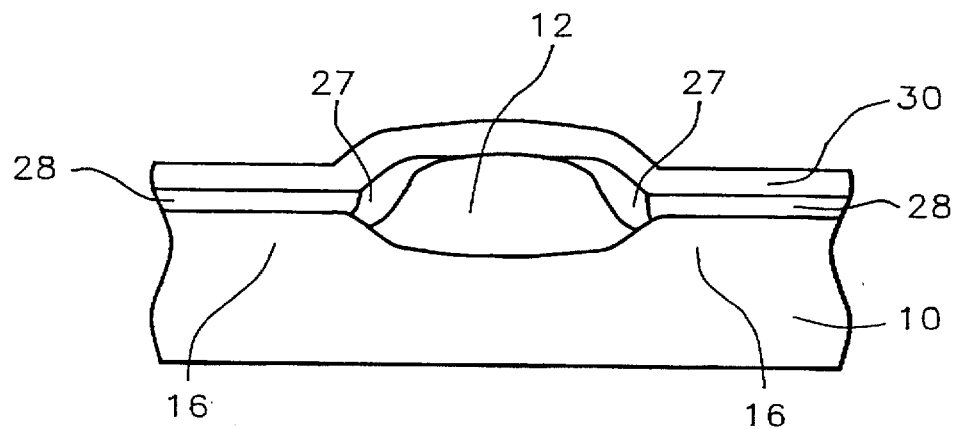
FIG. 9 shows a cross section of integrated circuit wafer of FIG. 8 showing the next level of processing after formation of the field oxide isolation regions with silicon nitride spacers.

As shown in FIGS. 7 and 8, the first sacrificial oxide layer is then removed and a layer of gate oxide 28 is formed over the active regions 16 of the integrated circuit substrate. As can be seen in FIG. 9, subsequent material depositions 30 will have improved step coverage and subsequent processing will be improved due the nitride spacers 27 filling the recesses in the field oxide.

After the removal of the first sacrificial oxide layer, see FIG. 7, a layer of second sacrificial oxide, not shown, can be grown to replace the layer of first sacrificial oxide. Further ion implantation processing can then be carried out such as the formation of source/drain regions. The layer of second sacrificial oxide is then removed and the gate oxide layer 28 is formed over the active region, see FIG. 8. As can be seen in FIG. 9, subsequent material depositions 30 will have improved step coverage and subsequent processing will be improved due the nitride spacers 27 filling the recesses in the field oxide.

Refer now to FIG. 9, there is shown an embodiment of the field oxide isolation region of this invention. As seen in FIG. 9, a field oxide isolation region 12 is formed in an integrated circuit substrate 12. The field oxide isolation region 12 has recesses near the active regions 16 of the substrate 10. Nitride spacers 27, such an silicon nitride $Si_3N_4$, are formed on the sidewalls of the field oxide 12 filling the recesses adjacent to the active region. The nitride spacers 27 provide a smooth surface for layers of subsequent material 30 formed over the field oxide and layer of gate oxide 28. The silicon nitride spacers 27 will provide improved step coverage for layers of material 30 formed over the field oxide 12 and gate oxide 28 for later processing steps.

While the invention has been particularly shown and described with reference to the preferred embodiments thereof, it will be understood by those skilled in the art that various changes in form and details may be made without departing from the spirit and scope of the invention.

What is claimed is:

1. A method of forming field oxide isolation, comprising the steps of:

providing an integrated circuit substrate having a first surface and an isolation region on said first surface;

forming a layer of pad oxide over said integrated circuit substrate;

forming a layer of first nitride on said layer of pad oxide;

forming an isolation pattern in said layer of first nitride by removing that part of said layer of first nitride directly over said isolation region;

forming a field oxide by means of oxidation of said isolation region of said integrated circuit substrate using said isolation pattern in said layer of first nitride as a mask, wherein said field oxide has a top and sidewalls extending above the first surface of said integrated circuit substrate;

removing said layer of first nitride and said layer of pad oxide, after forming said field oxide, by means of wet isotropic etching thereby forming recesses in said sidewalls of said field oxide;

forming a layer of sacrificial oxide on said integrated circuit substrate after removing said layer of first nitride and said layer of pad oxide;

forming device well regions in said integrated circuit substrate, after forming said layer of sacrificial oxide, by means of ion implantation;

forming a layer of second nitride on said integrated circuit substrate after forming said device well regions wherein said layer of second nitride covers said top and said sidewalls of said field oxide;

removing said layer of second nitride, except that part of said layer of second nitride on said sidewalls of said field oxide, using dry anisotropic etching thereby forming spacers of said second nitride on said sidewalls of said field oxide wherein said spacers cover said recesses in said sidewalls of said field oxide;

removing said layer of sacrificial oxide after forming said spacers of second nitride; and forming a layer of gate oxide on said integrated circuit substrate after removing said layer of sacrificial oxide.

2. The method of claim 1 wherein said pad oxide is silicon dioxide.

3. The method of claim 1 wherein said layer of first nitride is $Si_3N_4$.

4. The method of claim 1 wherein said second nitride is $Si_3N_4$.

5. The method of claim 1 wherein said layer of second nitride has a thickness of between about 1500 and 3000 Angstroms.

6. The method of claim 1 wherein said sacrificial oxide is silicon dioxide having a thickness of between about 160 and 240 Angstroms.

7. The method of claim 1 wherein said wet isotropic etching uses hydrogen fluoride and hot phosphoric acid.

8. The method of claim 1 wherein said dry anisotropic etching uses reactive ion etching.

9. The method of claim 1 wherein said field oxide is silicon dioxide.

10. A method of forming field oxide isolation, comprising the steps of:

providing a integrated circuit substrate having a first surface and an isolation region on said first surface;

forming a layer of pad oxide over said integrated circuit substrate;

forming a layer of first nitride on said layer of pad oxide;

forming an isolation pattern in said layer of first nitride by removing that part of said layer of first nitride directly over said isolation region;

forming a field oxide by means of oxidation of said isolation region of said integrated circuit substrate using said isolation pattern in said layer of first nitride as a mask, wherein said field oxide has a top and sidewalls extending above the first surface of said integrated circuit substrate;

removing said layer of first nitride and said layer of pad oxide, after forming said field oxide, by means of wet isotropic etching thereby forming recesses in said sidewalls of said field oxide;

forming a layer of first sacrificial oxide on said integrated circuit substrate after removing said layer of first nitride and said layer of pad oxide;

forming device well regions in said integrated circuit substrate, after forming said layer of first sacrificial oxide, by means of ion implantation;

forming a layer of second nitride on said integrated circuit substrate after forming said device well regions wherein said layer of second nitride covers said top and said sidewalls of said field oxide;

removing said layer of second nitride, except that part of said layer of second nitride on said sidewalls of said field oxide, using dry anisotropic etching thereby forming spacers of said second nitride on said sidewalls of said field oxide wherein said spacers cover said recesses in said sidewalls of said field oxide;

removing said layer of first sacrificial oxide after removing said spacers of second nitride;

forming a layer of second sacrificial oxide after removing said layer of first sacrificial oxide;

forming source/drain regions using ion implantation;

removing said layer of second sacrificial oxide after forming said source/drain regions; and forming a layer of gate oxide on said integrated circuit substrate after removing said layer of second sacrificial oxide.

11. The method of claim 10 wherein said pad oxide is silicon dioxide.

12. The method of claim 10 wherein said layer of first nitride is $Si_3N_4$.

13. The method of claim 10 wherein said second nitride is $Si_3N_4$.

14. The method of claim 10 wherein said layer of second nitride has a thickness of between about 1500 and 3000 Angstroms.

15. The method of claim 10 wherein said first sacrificial oxide and said second sacrificial oxide are silicon dioxide having a thickness of between about 160 and 240 Angstroms.

16. The method of claim 10 wherein said wet isotropic etching uses hydrogen fluoride and hot phosphoric acid.

17. The method of claim 10 wherein said dry anisotropic etching uses reactive ion etching.

18. The method of claim 10 wherein said field oxide is silicon dioxide.

\* \* \* \* \*